US010573712B2

(12) United States Patent
Sun et al.

(10) Patent No.: US 10,573,712 B2
(45) Date of Patent: Feb. 25, 2020

(54) SUPER-JUNCTION STRUCTURE AND METHOD FOR MANUFACTURING THE SAME AND SEMICONDUCTOR DEVICE THEREOF

(71) Applicant: Silergy Semiconductor Technology (Hangzhou) Ltd., Hangzhou (CN)

(72) Inventors: He Sun, Hangzhou (CN); Zhongping Liao, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/873,184

(22) Filed: Jan. 17, 2018

(65) Prior Publication Data

US 2018/0158900 A1   Jun. 7, 2018

Related U.S. Application Data

(63) Continuation-in-part of application No. 14/841,776, filed on Sep. 1, 2015, now Pat. No. 9,905,636.

(51) Int. Cl.
*H01L 29/78* (2006.01)
*H01L 29/739* (2006.01)
(Continued)

(52) U.S. Cl.
CPC .... *H01L 29/0634* (2013.01); *H01L 29/66333* (2013.01); *H01L 29/7395* (2013.01); *H01L 29/7802* (2013.01); *H01L 29/1095* (2013.01)

(58) Field of Classification Search
CPC .................................................. H01L 29/0634
See application file for complete search history.

(56) References Cited

U.S. PATENT DOCUMENTS 5,001,537 A * 3/1991 Colman ................. H01L 29/87
  257/173
7,638,841 B2 12/2009 Challa
(Continued)

FOREIGN PATENT DOCUMENTS

CN    202042487 U    11/2011
CN    103151384 A    6/2013
(Continued)

OTHER PUBLICATIONS

First Office Action for Chinese Patent Application No. 201410441028.9, dated Jul. 29, 2016, 6 pages.
(Continued)

*Primary Examiner* — Moazzam Hossain
(74) *Attorney, Agent, or Firm* — Westman, Champlin & Koehler, P.A.

(57) ABSTRACT

The present disclosure relates to a super-junction structure, a method for manufacturing the super-junction structure and a semiconductor device including the super-junction structure. The super-junction structure includes an epitaxy layer of a first doping type and a plurality of first pillar regions of a second doping type which are formed in the epitaxy layer and are separated from each other. Each of the first pillar regions has a doping concentration that decreases from bottom to top. A portion of the epitaxy layer between adjacent ones of the first pillar regions is a second pillar region. The first pillar regions and the second pillar region are arranged alternatively to form the super-junction structure. The first pillar regions are characterized by the doping concentration that decreases from bottom to top so that the super-junction structure has a relatively high breakdown voltage and a relatively low on resistance. Moreover, the super-junction structure changes a path of an avalanche (Continued)

current and thus suppresses an avalanche current so that the device is not easily damaged.

15 Claims, 2 Drawing Sheets

(51) Int. Cl.
*H01L 29/417* (2006.01)
*H01L 29/49* (2006.01)
*H01L 29/36* (2006.01)
*H01L 29/06* (2006.01)
*H01L 29/66* (2006.01)
*H01L 29/10* (2006.01)

(56) References Cited

U.S. PATENT DOCUMENTS

| | | |
|---|---|---|
| 2003/0073287 A1 | 4/2003 | Kocon |
| 2003/0080376 A1* | 5/2003 | Rutter ............... H01L 29/0634 257/328 |
| 2003/0148559 A1 | 8/2003 | Onishi et al. |
| 2004/0031987 A1 | 2/2004 | Henninger et al. |
| 2004/0108568 A1* | 6/2004 | Qu ..................... H01L 29/0634 257/500 |
| 2005/0035371 A1 | 2/2005 | Fujihira |
| 2011/0012130 A1* | 1/2011 | Zhang ................ H01L 29/1095 257/77 |
| 2011/0068406 A1* | 3/2011 | Yasuhara ........... H01L 29/0847 257/367 |
| 2011/0127606 A1* | 6/2011 | Bobde ................ H01L 27/0705 257/337 |
| 2013/0075855 A1 | 3/2013 | Guan et al. |
| 2013/0134487 A1* | 5/2013 | Lin ................... H01L 29/66712 257/288 |
| 2014/0252456 A1 | 9/2014 | Liao |
| 2015/0076600 A1 | 3/2015 | Jun et al. |

FOREIGN PATENT DOCUMENTS

| | | |
|---|---|---|
| CN | 103413762 A | 11/2013 |
| CN | 203659876 U | 6/2014 |

OTHER PUBLICATIONS

USPTO-issued prosecution history for U.S. Appl. No. 14/841,775, including: Notice of Allowance and Fees Due (PTOL-85) dated Oct. 16, 2017, 12 pages; Non-Final Rejection dated May 22, 2017, 15 pages; Advisory Action (PTOL-303) dated Feb. 14, 2017, 3 pages; Final Rejection dated Dec. 6, 2016, 15 pages; Non-Final Rejection dated May 6, 2016, 16 pages; and Requirement for Restriction/Election dated Feb. 19, 2016, 7 pages; 68 total pages.

* cited by examiner

SUPER-JUNCTION STRUCTURE AND METHOD FOR MANUFACTURING THE SAME AND SEMICONDUCTOR DEVICE THEREOF

CLAIM OF PRIORITY

This application is a continuation-in-part application of U.S. application Ser. No. 14/841,776, filed on Sep. 1, 2015, published on Mar. 3, 2016, as U.S. Publication No. 2016-0064478 A1, and claims priority to Chinese Application No. 201410441028.9, filed Sep. 1, 2014 (published as CN 10421376 A), which are hereby incorporated by reference.

BACKGROUND OF THE DISCLOSURE

Field of the Disclosure

The present disclosure relates to semiconductor devices, and more particularly, to a super-junction structure, a method for manufacturing the super-junction structure and a semiconductor device including the super-junction structure.

Description of the Related Art

High-power semiconductor devices, such as metal-oxide-semiconductor field effect transistors (MOSFETs), insulated gate bipolar transistors (IGBTs) and the like, typically decreases a doping concentration of a drift region for a high breakdown voltage. However, the drift region will have a large on resistance if having a low doping concentration. Thus, the conventional approach cannot take into account both a high breakdown voltage and a low on resistance.

To achieve both a high breakdown voltage and a low resistance in semiconductor devices, a super-junction structure may be used as a drift region, instead of a simple epitaxy layer. The super-junction structure is a structure in which N-type pillar regions and P-type pillar regions are arranged alternatively. FIG. 1 is a structural diagram of a super-junction structure as a drift region of a MOSFET according to the prior art. As shown in FIG. 1, a plurality of P-type pillar regions are formed in an N$^-$-type epitaxy layer and are separated from each other. An N-type pillar region is located between two adjacent P-type pillar regions. The P-type region and the N-type pillar regions are arranged alternatively in the epitaxy layer to form a super-junction structure. The super-junction structure achieves both a high breakdown voltage and a low on resistance in the MOSFET.

When a voltage is applied to a substrate of the MOSFET, an avalanche current occurs and flows from a source region to a drain region. The P-type pillar regions are doped uniformly, and the P-type well regions are located at the top surfaces of the P-type pillar regions and have a doping concentration larger than that of the P-type pillar regions. Thus, the avalanche current flows into the P-type well regions at one side and passes through a base resistor RB of a parasitic transistor BJT of the MOSFET. A large voltage drop occurs across the base resistor RB and turns on the parasitic transistor, which in turn amplifies the avalanche current and damage the device. Consequently, the conventional super-junction structure cannot really suppress an avalanche current even in a case that the super-junction structure is used as a drift region of the semiconductor device.

BRIEF DESCRIPTION OF THE DISCLOSURE

In view of this, the present disclosure provides a super-junction structure, a method for manufacturing the same, and a semiconductor device including the same to solve the problem of suppressing an avalanche current over the conventional super-junction.

In a first embodiment, there is provided a super-junction structure, comprising: an epitaxy layer of a first doping type; a plurality of first pillar regions of a second doping type, which are formed in said epitaxy layer and separated from each other, extending from a top surface of said epitaxy layer to a surface over a bottom surface of said epitaxy layer; and a plurality of second pillar regions, which are configured as remaining portion of said epitaxy layer between two adjacent first pillar regions and arranged alternatively with said first pillar regions to form said super-junction structure; wherein the doping concentration of a bottom portion of said first pillar regions is higher than that of a top portion of said first pillar regions to provide a path for an avalanche current through said first pillar regions.

Preferably, the dopant amount of said first pillar region is not less than that of said second pillar region.

Preferably, the dopant amount of said first pillar region is 1-1.2 times of that of said second pillar region.

Preferably, said first pillar region comprises a first sub-pillar region and a second sub-pillar region stacked on said first sub-pillar region, and a doping concentration of said second sub-pillar region is less than that of said first sub-pillar region.

Preferably, said second sub-pillar region is aligned to and stacked on said first sub-pillar region, and a width of said second sub-pillar region is not greater than that of said first sub-pillar region. 6. The super-junction structure according to claim 4, wherein said first sub-pillar region has a doping concentration higher than an average doping concentration of said first pillar region, and said second sub-pillar region has a doping concentration lower than said average doping concentration of said first pillar region; wherein said average doping concentration is determined in accordance with the dopant amount of said second pillar region.

Preferably, said first doping type is an N type and said second doping type is a P type.

In a second embodiment, there is provided a semiconductor device, comprising: a semiconductor substrate; a super-junction structure according to claim 1, being arranged above said semiconductor substrate; well regions of said second doping type, contacting top surfaces of said plurality of first pillar regions and a portion of said top surface of second pillar region; source regions of said first doping type, being arranged at surfaces of said well regions; a gate oxide, being arranged above said second pillar region, portions of said well regions and portions of said source regions; a polysilicon gate, being arranged above said gate oxide; a front-side metal layer contacting said source regions; and a back-side metal layer being arranged below and contacts said semiconductor substrate.

Preferably, the semiconductor device further comprises an extension portion arranged between said second pillar region and said gate oxide, and arranged between two adjacent well regions.

Preferably, the semiconductor device further comprises contact regions on surfaces of said well regions, wherein said front-side metal layer is contacted to said source regions and said contact regions.

In a third embodiment, there is provided a semiconductor device, comprising: a first semiconductor layer; a super-junction structure according to claim 1, being arranged above said first semiconductor layer; and a second semiconductor layer above said super-junction structure, wherein in a case that said first semiconductor layer is of said first doping type, said second semiconductor layer is of said second doping type, and in a case that said first semiconductor layer is of said second doping type, said second semiconductor layer is of said first doping type.

In a fourth embodiment, there is provided a A method for manufacturing a super-junction structure, comprising: forming an epitaxial layer of a first doping type; forming a plurality of separated first pillar regions of a second doping type in said epitaxy layer extending from a top surface of said epitaxy layer to a surface over a bottom surface of said epitaxy layer; and forming a plurality of second pillar regions configured as remaining portion of said epitaxy layer between two adjacent first pillar regions and arranged alternatively with said first pillar regions to form said super-junction structure; wherein the doping concentration of a bottom portion of said first pillar regions is higher than that of a top portion of said first pillar regions to provide a path for an avalanche current through said first pillar regions.

Preferably, the formation of said first pillar regions comprises: a) forming a first sub-epitaxy layer of a first dopant type on a substrate; b) forming first pillar regions of a second dopant type in said sub-epitaxy layer extending from a top surface of said sub-epitaxy layer to a surface over a bottom surface of said sub-epitaxy layer by implanting; c) forming a second sub-epitaxy layer on said first sub-epitaxy layer; d) forming second pillar regions of a second dopant type in said second sub-epitaxy layer extending through said second sub-epitaxy layer by implanting, wherein said second pillar regions is aligned with said first columnar regions; e) repeating the steps c) and d) to form said first pillar regions and said second pillar regions.

Preferably, the formation of said first pillar regions comprises: a) forming an epitaxy layer of a first dopant type on a substrate; b) forming a plurality of trenches in said epitaxy layer extending from a top surface of said epitaxy layer; c) filling dopant of second type on bottom surface of said trenches to fill in part of said trenches; d) repeating the step c) until said trenches is filled up.

Preferably, the formation of said first pillar regions comprises: a) forming an epitaxy layer of a first dopant type on a substrate; b) forming a plurality of trenches in said epitaxy layer extending from a top surface of said epitaxy layer; c) implanting dopant of second type on bottom surface of said trenches to form first sub-pillar regions with a first doping concentration; d) filling dopant of second type on said first sub-pillar regions to form second sub-pillar regions with a second doping concentration lower than said first doping concentration.

To sum up, the super-junction structure according to the present disclosure includes first pillar regions having first sub-pillar regions with a large doping concentration and second sub-pillar regions with a low doping concentration from bottom to top. When a high voltage is applied to the semiconductor device including the super-junction structure, an avalanche current flows into the first pillar regions from the first sub-pillar regions with the high doping concentration. Consequently, a path of the current is changed. The first pillar regions are characterized by the doping concentration that decreases from bottom to top so that the super-junction structure has a relatively high breakdown voltage and a relatively low on resistance. Moreover, the super-junction structure changes a path of an avalanche current and thus suppresses an avalanche current so that the device is not easily damaged.

BRIEF DESCRIPTION OF THE DRAWINGS

Those technical solutions according to embodiments of the present disclosure and the prior art will be apparent when they are described in connection with appended drawings which are firstly described briefly hereinbelow. It will be obvious to one skilled in the art that the following appended drawings show only some embodiments of the present disclosure. Other appended drawings can be obtained from these appended drawings without the need for creative work.

DETAILED DESCRIPTION OF EMBODIMENTS OF THE INVENTION

Reference will now be made in detail to particular embodiments of the disclosure in conjunction with appended drawings, so that objectives, features and advantages of the disclosure will become more apparent. For the purpose of clarity, some parts in the appended drawings are not drawn to scale. Further, for simplicity, a structure may be shown in one drawing while it may be actually obtained after several steps, and some well-known details may be omitted.

Some particular details will be described for thorough understanding of the present disclosure. However, the present disclosure may be practiced with or without these particular details by one skilled person, without departing the principles of the present disclosure. Thus, the present disclosure is not limited to the particular embodiments below.

Figure 1:
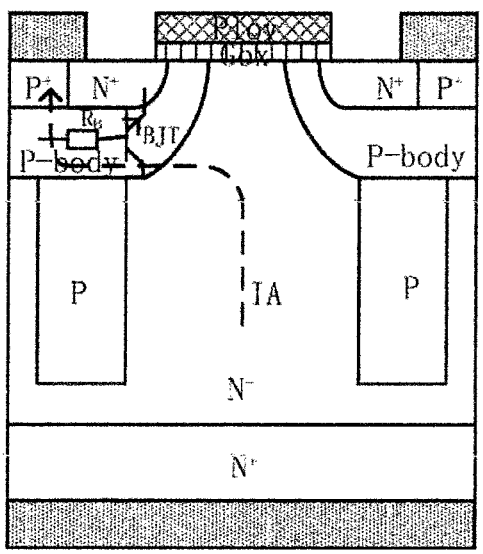
FIG. 1 is a structural diagram of a super-junction structure of a MOSFET according to the prior art.
Figure 2:
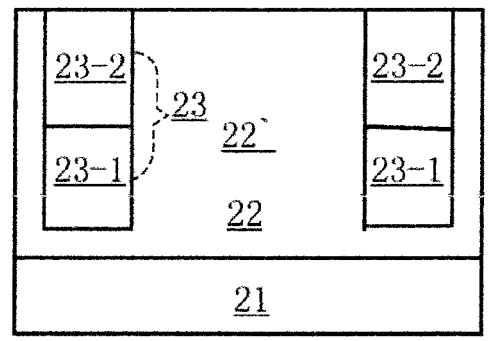
FIG. 2 is a structural diagram of a super-junction structure according to an embodiment of the present disclosure.

FIG. 2 is a structural diagram of a super-junction structure according to an embodiment of the present disclosure.

Referring to FIG. 2, an embodiment of the present disclosure is related to a super-junction structure formed on a substrate 21. The super-junction structure includes an epitaxy layer 22 of a first doping type, and a plurality of first pillar regions 23 of a second doping type, which are formed in the epitaxy layer 22 and separated from each other, and a second pillar region 22', which is a portion of the epitaxy layer 22 between adjacent ones of the plurality of first pillar regions 23 and arranged alternatively with the plurality of first pillar regions 23 to form the super-junction structure.

Each of the plurality of first pillar regions 23 comprises a first sub-pillar region 23-1, i.e. a portion near the substrate 21, with a doping concentration larger than an average doping concentration of the plurality of first pillar regions 23, and a second sub-pillar region 23-2, i.e. a portion far away from the substrate 21, with a doping concentration less than an average doping concentration of the plurality of first pillar regions.

The average doping concentration is a doping concentration of the plurality of first pillar regions 23 in a case that the plurality of first pillar regions 23 have a uniform doping concentration and have a dopant amount equal to that of the second pillar region 22'.

In the super-junction structure according to an embodiment of the present disclosure, the first type is one of an N type and a P type, and the second type is the other of the N type and the P type. The first doping type may be obtained by doping or diffusing a dopant of a first type into a semiconductor layer or region, and the second doping type may be obtained by doping or diffusing a dopant of a second type into a semiconductor layer or region. The dopant of the first type is that of one of an N type and a P type, and the dopant of the second type is that of the other of an N type and a P type. The semiconductor material includes for example group III-V semiconductor, such as GaAs, InP, GaN, and SiC, and group IV semiconductor, such as Si, and Ge. The N-type doping region may be of an $N^-$-type or an $N^+$-type, and the P-type doping region may be of a $P^-$-type or a $P^+$-type. The N-type or P-type indicates to be lightly doped with a low doping concentration, and the $N^+$-type or $P^+$-type indicates to be heavily doped with a high doping concentration. In this and the following embodiments, the first doping type is an N type, and the second doping type is a P type, as an example only. It will be understood by one skilled person that the super-junction structure in these embodiments can also be implemented in a case that the first doping type is a P type, and the second doping type is an N type. A P-type doping region is formed by implanting or diffusing a P-type dopant in a semiconductor layer or region, for example, a trivalent acceptor impurity such as B, Al, and the like. An N-type doping region is formed by implanting or diffusing an N-type dopant in a semiconductor layer or region, for example, a quinquevalent donor impurity such as P, As, and the like.

In the super-junction structure according to the embodiment of the present disclosure, the first pillar regions 23 are P-type doped semiconductor regions, and the second pillar region 22' is an N-type doped semiconductor region. The first pillar regions 23 and the second pillar region 22' constitute a super-junction structure, i.e. super PN junction structure. Different from a conventional super-junction structure, the first pillar regions 23 are P-type doped regions with a non-uniform doping concentration. Instead, the first pillar regions 23 has a doping concentration that decreases from bottom to top, including a first sub-pillar region 23-1 of a P-type with a relatively high doping concentration (i.e. $P^+$) and a second sub-pillar region 23-3 of an N type with a relatively low doping concentration (i.e. P). The doping concentration of the first sub-pillar region 23-1 is larger than an average doping concentration of the first pillar regions 23, and the doping concentration of the second sub-pillar region 23-2 is smaller than an average doping concentration of the first pillar regions 23, so that the first pillars have a dopant amount equal to or slightly larger than that of the second pillar region 22'. In a case that the super-junction structure with the above structural features is used in a high-power device, such as MOSFET, IGBT and the like, an avalanche current flows in a path excluding a parasitic resistor of well regions, when a high voltage is applied. Accordingly, the parasitic transistor will not be turned on to amplify the avalanche current. The semiconductor device will have an improve performance for suppressing the avalanche current.

Thus, the super-junction structure according to the embodiment of the present disclosure has a relatively high breakdown voltage and a relatively low on resistance, and suppresses an avalanche current so that the semiconductor device is not damaged.

Figure 3:
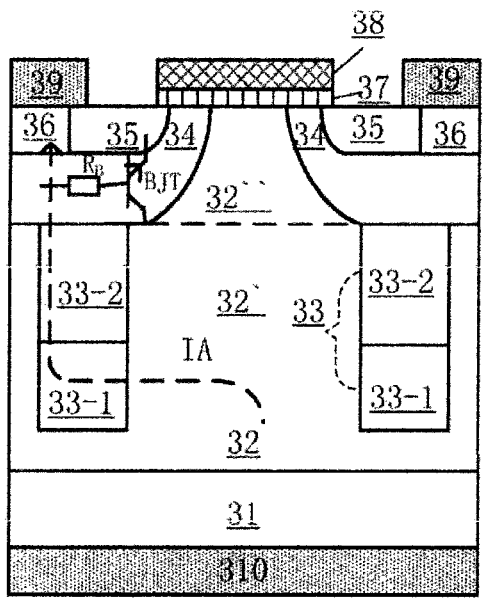
FIG. 3 is a structural diagram of a semiconductor device according to an embodiment of the present disclosure.

FIG. 3 is a structural diagram of a semiconductor device according to an embodiment of the present disclosure.

Referring to FIG. 3, an embodiment of the present disclosure is related to a semiconductor device. The semiconductor device includes a semiconductor substrate 31, a super-junction structure as mentioned above, well regions 34 of the second doping type, source regions 35 of the first doping type, a gate oxide 37, a polysilicon gate 38, a front-side metal layer 39 and a back-side metal layer 310. The super-junction structure includes an epitaxy layer 32 of a first doping type, and a plurality of first pillar regions 33 of a second doping type, which are formed in the epitaxy layer 32 and separated from each other, and a second pillar region 32', which is arranged between adjacent ones of the first pillar regions 33. The first pillar regions 33 include a first sub-pillar region 33-1 and a second sub-pillar region 33-2 from bottom to top.

The well regions 34 contact top surfaces of the first pillar regions 33 and a portion of the top surface of second pillar region 32'. It should be noted that in a case that the above super-junction structure is used in the semiconductor device according to an embodiment of the present disclosure, the second pillar region 32' has an extension portion extending upward. That is, the semiconductor device further comprises an extension portion 32" above the second pillar region 32', below the gate oxide 37, and between adjacent ones of the well regions 34. In a case that the above super-junction structure is used in the semiconductor device according to the present disclosure, it will be understood by one skilled person that the second pillar region should be extended with an extension region 32" and how to form it.

The source regions 35 are located above the well regions 34. The gate oxide 37 is located above the second pillar region 32', portions of the well regions 34 and portions of the source regions 35. The polysilicon gate 38 is located above the gate oxide 37. The front-side metal layer 39 contacts the source regions 35, as source electrodes. The back-side metal layer 310 is located below the semiconductor substrate 31 and contacts the semiconductor substrate 31, as drain electrodes.

In the semiconductor device according to the embodiment of the present disclosure, it further comprises contact regions 36 of the second doping type, at surfaces of the well regions 34. The front-side metal layer 39 contacts the source regions 35 and the contact regions 36, as soured electrodes.

In the semiconductor device according to the embodiment of the present disclosure, the first pillar regions 33 and the second pillar region 32' constitute a super-junction structure, in which the first pillar regions have a dopant amount approximately equal to or slightly larger than that of the second pillar region, with a ratio in a range between 1:1 to 1.2:1. Due to such a super-junction structure, the semiconductor device will have both a relatively high breakdown voltage and a relatively low on resistance. Moreover, the first sub-pillar regions 33-1 as lower portions of the first pillar regions 33 have a doping concentration larger than that of the second sub-pillar regions 33-2 as upper portions of the first pillar regions 33, and larger than an average doping concentration of the first pillar regions 33. Due to such a structure, a breakdown point will be located at the first sub-pillar regions 33-1 having a relatively high doping concentration when the semiconductor device is applied with a high voltage. An avalanche current flows into the first pillar regions at the first sub-pillar regions 33-1 as the low portions of the first pillar region 33, from the drain regions, and then flows into the well regions 34 from the first sub-pillar regions 33-1, and finally flows into the front-side metal layer 39. Thus, the avalanche current IA will not flow into the well regions 34 at one side of the well regions 34. Instead, the avalanche current changes its path, and flows in a path excluding a base resistor RB of the well regions 34. Thus, there is no voltage drop at the base resistor RB of a parasitic transistor BJT of the well regions 34 for turning on the parasitic transistor BJT and amplifying the avalanche current IA. The semiconductor device can suppress the avalanche current.

In the semiconductor device according to the embodiment of the present disclosure, the substrate 31 may be doped as a P type or an N type. The N-type doping region may be of an $N^-$-type or an $N^+$-type, and the P-type doping region may be of a $P^-$-type or a $P^+$-type. The $N^-$-type or $P^+$-type indicates to be lightly doped with a low doping concentration, and the $N^+$-type or $P^+$-type indicates to be heavily doped with a high doping concentration.

Accordingly, the semiconductor device according to the embodiment of the present disclosure has both a relatively high breakdown voltage and a relatively low on resistance, and suppresses an avalanche current so that the device is not easily damaged.

Figure 4:
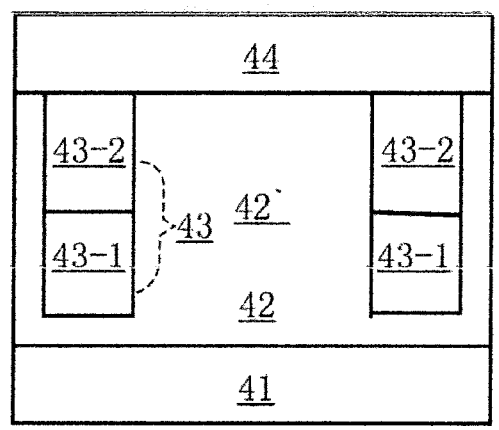
FIG. 4 is a structural diagram of a semiconductor device according to another embodiment of the present disclosure.

FIG. 4 is a structural diagram of a semiconductor device according to another embodiment of the present disclosure.

Referring to FIG. 4, another embodiment of the present disclosure is related to another semiconductor device. The another semiconductor device includes a first semiconductor layer 41, a super-junction structure as mentioned above, and a second semiconductor layer 44 of the second doping type on the surface of the super-junction structure. The first semiconductor layer 41 may be of a first doping type and the second semiconductor layer 44 may be of a second doping type, or vice versa. The super-junction structure includes an epitaxy layer 42 of a first doping type, and a plurality of first pillar regions 43 of a second doping type, which are formed in the epitaxy layer 42 and separated from each other, and a second pillar region 42', which is arranged between adjacent ones of the first pillar regions 43. The first pillar regions 43 include a first sub-pillar region 43-1 and a second sub-pillar region 43-2 from bottom to top.

The dopant of the first type is that of one of an N type and a P type, and the dopant of the second type is that of the other of an N type and a P type. The N-type doping region may be of an $N^-$-type or an $N^+$-type, and the P-type doping region may be of a $P^-$-type or a $P^+$-type. The $N^-$-type or $P^-$-type indicates to be lightly doped with a low doping concentration, and the $N^+$-type or $P^+$-type indicates to be heavily doped with a high doping concentration. For example, in the present embodiment, the first semiconductor layer may be an $N^+$-type silicon layer, the epitaxial layer 42 may be an $N^-$-type silicon layer, the first sub-pillar regions 43-1 may be a $P^+$-type silicon layer, the second sub-pillar region 43-2 may be a $P^-$-type silicon layer, and the second semiconductor layer may be $P^+$-type silicon layer.

In the semiconductor device according to the embodiment of the present disclosure, the first pillar regions 43 and the second pillar Regina 42' are formed in the epitaxial layer 42 to form a super-junction structure. Moreover, the first pillar regions 43 have a doping concentration that decreases from bottom to top, so that the semiconductor device improves the performance of suppressing an avalanche current even in a case that the semiconductor device has the same breakdown voltage. That is, the semiconductor device has better voltage endurance and can be used in a high-power integrated circuit.

An embodiment of the present disclosure relates to a method for manufacturing the super-junction structure as shown in FIG. 2. The super-junction may be formed on a substrate. The method for manufacturing the super-junction structure includes:

forming an epitaxial layer of a first doping type;

forming a plurality of first sub-pillar regions of a second doping type in the epitaxial layer, wherein the plurality of first sub-regions are separated from each other;

the first sub-pillar regions have a first doping concentration;

forming a plurality of second sub-pillar regions on the plurality of first sub-pillar regions in the epitaxial layer;

the second sub-pillar regions have a second doping concentration;

each of the plurality of first sub-pillar regions is aligned in a vertical direction to and connected to respective one of the plurality of second sub-pillar regions to form respective one of a plurality of first pillar regions;

a portion of the epitaxy layer between adjacent ones of the plurality of first pillar regions forms a second pillar region, the first doping concentration is larger than an average doping concentration of the first pillar regions, and the second doping concentration is less that the average doping concentration;

wherein the average doping concentration is a doping concentration of the plurality of first pillar regions in a case that the plurality of first pillar regions have a uniform doping concentration and the plurality of first pillar region has a dopant amount equal to that of the second pillar region.

The substrate may be one of a P type and an N type. The dopant of the first type is that of one of an N type and a P type, and the dopant of the second type is that of the other of an N type and a P type. The N-type doping region may be of an $N^-$-type or an $N^+$-type, and the P-type doping region may be of a $P^-$-type or a $P^+$-type. The $N^-$-type or $P^-$-type indicates to be lightly doped with a low doping concentration, and the $N^+$-type or $P^+$-type indicates to be heavily doped with a high doping concentration. For example, in the present embodiment, the substrate may be an $N^+$-type silicon layer, the epitaxial layer may be an $N^-$-type silicon layer, the first sub-pillar regions may be a $P^+$-type silicon layer, the second sub-pillar region may be a $P^-$-type silicon layer.

Figure 5A:
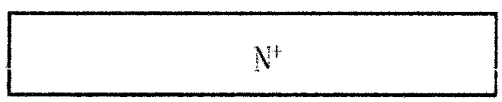
FIGS. 5a-5c are cross-sectional views of semiconductor structures at various stages of a method for manufacturing a super-junction structure according to an embodiment of the present disclosure.
Figure 5B:
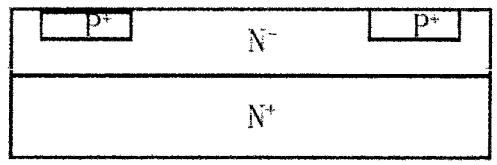
Figure 5C:
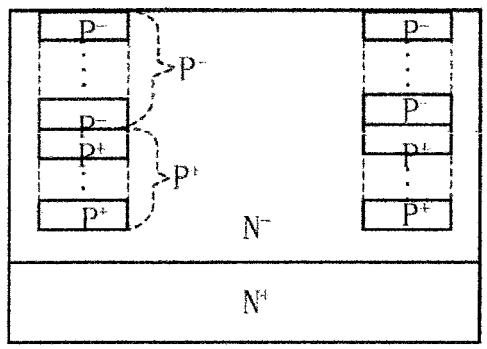

In a case that the $N^-$-type epitaxial layer of the super-junction structure includes a plurality of sub-epitaxial layers, the method for manufacturing the super-junction structure on the $N^+$-type substrate may include the following steps.

a) forming an $N^-$-type sub-epitaxial layer, such as an $N^-$-type silicon layer, as shown in FIG. 5a;

b) doping the sub-epitaxial layer with a $P^+$-type dopant to form a plurality of $P^+$-type pillar regions which have the first doping concentration and are separated from each other, as shown in FIG. 5b;

c) forming a second $N^-$-type sub-epitaxial layer on a surface of the above structure;

d) repeating step b);

e) repeating steps c) and d) for a predetermined times;

f) repeating step c);

g) doping the second sub-epitaxial layer with a $P^-$-type dopant to form a plurality of $P^-$-type pillar regions which are separated from each other and have the second doping concentration less than the first doping concentration; and h) repeating steps f) and g) for a predetermined times, as shown in FIG. 5c.

In the above steps, each of the plurality of pillar regions formed in a previous step is aligned in a vertical direction to and connected to respective one of the plurality of pillar regions formed in a subsequent step, to form the plurality of first sub-pillar regions having the same width by connecting the P+-type pillar regions having the first doping concentration, and to form the plurality of second sub-pillar regions by connecting the P−-type pillar regions having the second doping concentration.

The embodiments of the present disclosure also include two methods for forming trenches, besides the above methods for forming the P+-type first sub-pillar regions and the P−-type second sub-pillar regions.

Figure 6A:
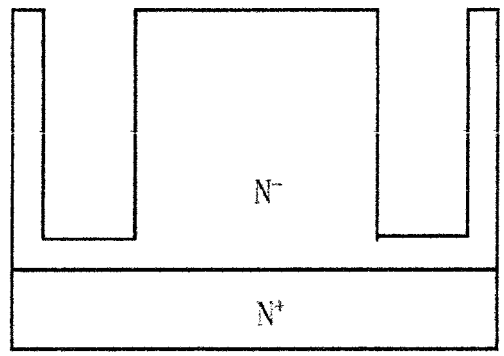
FIGS. 6a-6c are cross-sectional views of semiconductor structures at various stages of another method for manufacturing a super-junction structure according to an embodiment of the present disclosure.
Figure 6B:
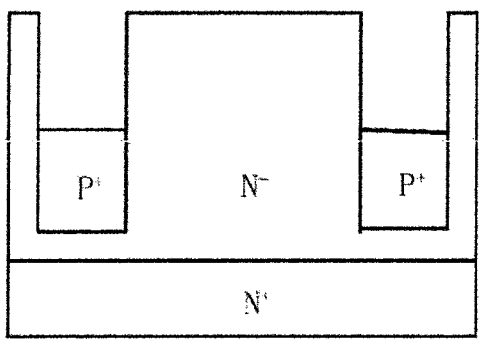
Figure 6C:
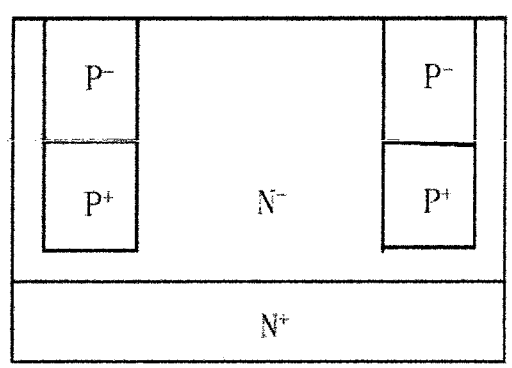

A first method for forming the trenches is shown in FIGS. 6a-6c. After forming an N−-type epitaxial layer, a plurality of trenches are formed in the epitaxial layer, which are separated from each other. A portion of the epitaxial layer between adjacent ones of the trenches is a second pillar region. Then, P+-type first sub-pillar regions and P−-type second sub-pillar regions are formed in the trenches from bottom to top. As shown in FIG. 6b, the P+-type first sub-pillar regions are formed at lower portions of the trenches by filling the lower portions of the trenches with a P+-type layer, such as P+-type silicon layer. Finally, as shown in FIG. 6c, the P−-type second sub-pillar regions are formed at upper portions of the trenches by filling the upper portions of the trenches with a P−-type layer above the P+-type first sub-pillar regions, such as P−-type silicon layer. That is, each of the plurality of first pillar regions comprises a first sub-pillar region, i.e. a portion near the substrate, and a second sub-pillar region, i.e. a portion far away from the substrate, from bottom to top in one of the trenches.

Figure 7A:
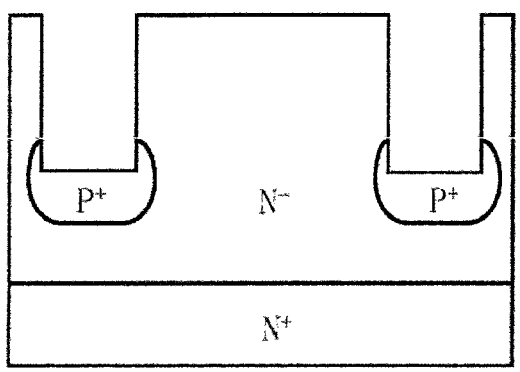
FIGS. 7a-7b are cross-sectional views of semiconductor structures at various stages of a further method for manufacturing a super-junction structure according to an embodiment of the present disclosure.
Figure 7B:
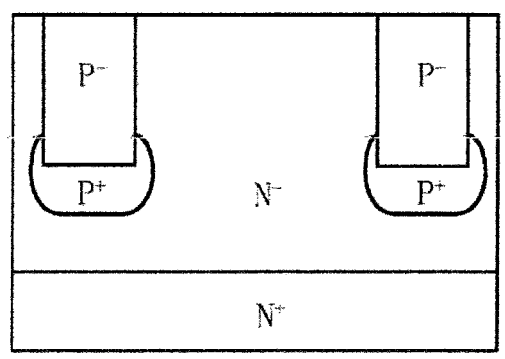

A second method for forming the trenches is shown in FIGS. 7a and 7b. After forming an N−-type epitaxial layer, a plurality of trenches are formed in the epitaxial layer, which are separated from each other. The first sub-pillar regions at bottoms of the trenches by doping the bottoms of the trenches with a P+-type dopant. Then, as shown in FIG. 7b, the P−-type second sub-pillar regions are formed at upper portions of the trenches by filling the upper portions of the trenches with a P−-type layer above the P+-type first sub-pillar regions. Thus, the first sub-pillar regions and the second sub-pillar regions constitute the first pillar regions.

It should be noted that in the present disclosure, a P-type dopant may be a trivalent acceptor impurity such as B, Al, and the like, and an N-type dopant may be a quinquevalent donor impurity such as P, As, and the like. It should also be understood that the relational terms such as "first", "second", and the like are used in the context merely for distinguishing one element or operation from the other element or operation, instead of meaning or implying any real relationship or order of these elements or operations.

Although various embodiments of the present disclosure are described above, these embodiments neither present all details, nor imply that the present disclosure is limited to these embodiments. Obviously, many modifications and changes may be made in light of the teaching of the above embodiments. These embodiments are presented and some details are described herein only for explaining the principle of the disclosure and its actual use, so that one skilled person can practice the present disclosure and introduce some modifications in light of the disclosure. The invention is intended to cover alternatives, modifications and equivalents that may be included within the spirit and scope of the invention as defined by the appended claims.

What is claimed is:

1. A super-junction structure, comprising:
an epitaxy layer of a first doping type;
a plurality of first pillar regions of a second doping type, which are formed in said epitaxy layer and separated from each other, extending from a top surface of said epitaxy layer to a surface over a bottom surface of said epitaxy layer; and
a second pillar region, which is configured as a remaining portion of said epitaxy layer between two adjacent first pillar regions to form said super-junction structure;
wherein the doping concentration of a bottom portion of said first pillar regions is higher than that of a top portion of said first pillar regions to provide a path for an avalanche current through said first pillar regions.

2. The super-junction structure according to claim 1, wherein the dopant amount of said first pillar region is not less than that of said second pillar region.

3. The super-junction structure according to claim 1, wherein the dopant amount of said first pillar region is 1-1.2 times of that of said second pillar region.

4. The super-junction structure according to claim 1, wherein said first pillar region comprises a first sub-pillar region and a second sub-pillar region stacked on said first sub-pillar region, and a doping concentration of said second sub-pillar region is less than that of said first sub-pillar region.

5. The super-junction structure according to claim 4, wherein said second sub-pillar region is aligned to and stacked on said first sub-pillar region, and a width of said second sub-pillar region is not greater than that of said first sub-pillar region.

6. The super-junction structure according to claim 4, wherein said first sub-pillar region has a doping concentration higher than an average doping concentration of said first pillar region, and said second sub-pillar region has a doping concentration lower than said average doping concentration of said first pillar region;
wherein said average doping concentration is determined in accordance with the dopant amount of said second pillar region.

7. The super-junction structure according to claim 1, wherein said first doping type is an N type and said second doping type is a P type.

8. A semiconductor device, comprising:
a semiconductor substrate;
a super-junction structure according to claim 1, being arranged above said semiconductor substrate;
well regions of said second doping type, contacting top surfaces of said plurality of first pillar regions and a portion of said top surface of second pillar region;
source regions of said first doping type, being arranged at surfaces of said well regions;
a gate oxide, being arranged above said second pillar region, portions of said well regions and portions of said source regions;
a polysilicon gate, being arranged above said gate oxide;
a front-side metal layer contacting said source regions; and
a back-side metal layer being arranged below and contacts said semiconductor substrate.

9. The semiconductor device according to claim 8, further comprising an extension portion arranged between said second pillar region and said gate oxide, and arranged between two adjacent well regions.

10. The semiconductor device according to claim 9, further comprising contact regions on surfaces of said well regions, wherein said front-side metal layer is contacted to said source regions and said contact regions.

11. A semiconductor device, comprising:
a first semiconductor layer;

a super-junction structure according to claim 1, being arranged above said first semiconductor layer; and a second semiconductor layer above said super-junction structure, wherein in a case that said first semiconductor layer is of said first doping type, said second semiconductor layer is of said second doping type, and in a case that said first semiconductor layer is of said second doping type, said second semiconductor layer is of said first doping type.

12. A method for manufacturing a super-junction structure, comprising:

forming an epitaxial layer of a first doping type;

forming a plurality of separated first pillar regions of a second doping type in said epitaxy layer extending from a top surface of said epitaxy layer to a surface over a bottom surface of said epitaxy layer; and forming a second pillar region configured as a remaining portion of said epitaxy layer between two adjacent first pillar regions to form said super-junction structure;

wherein the doping concentration of a bottom portion of said first pillar regions is higher than that of a top portion of said first pillar regions to provide a path for an avalanche current through said first pillar regions.

13. The method according to claim 12, wherein the formation of said first pillar regions comprises:

a) forming a first sub-epitaxy layer of a first dopant type on a substrate;

b) forming first pillar regions of a second dopant type in said sub-epitaxy layer extending from a top surface of said sub-epitaxy layer to a surface over a bottom surface of said sub-epitaxy layer by implanting;

c) forming a second sub-epitaxy layer on said first sub-epitaxy layer;

d) forming a second pillar region of a second dopant type in said second sub-epitaxy layer extending through said second sub-epitaxy layer by implanting, wherein said second pillar region is aligned with said first pillar region;

e) repeating the steps c) and d) to form said first pillar regions and said second pillar region.

14. The method according to claim 12, wherein the formation of said first pillar regions comprises:

a) forming an epitaxy layer of a first dopant type on a substrate;

b) forming a plurality of trenches in said epitaxy layer extending from a top surface of said epitaxy layer;

c) filling dopant of second type on bottom surface of said trenches to fill in part of said trenches;

d) repeating the step c) until said trenches is filled up.

15. The method according to claim 12, wherein the formation of said first pillar regions comprises:

a) forming an epitaxy layer of a first dopant type on a substrate;

b) forming a plurality of trenches in said epitaxy layer extending from a top surface of said epitaxy layer;

c) implanting dopant of second type on bottom surface of said trenches to form first sub-pillar regions with a first doping concentration;

d) filling dopant of second type on said first sub-pillar regions to form second sub-pillar regions with a second doping concentration lower than said first doping concentration.

\* \* \* \* \*